United States Patent
Roy

(12) 
(10) Patent No.: US 6,249,471 B1
(45) Date of Patent: Jun. 19, 2001

(54) FAST FULL SIGNAL DIFFERENTIAL OUTPUT PATH CIRCUIT FOR HIGH-SPEED MEMORY

(75) Inventor: Richard S. Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/605,221

(22) Filed: Jun. 28, 2000

(51) Int. Cl.[7] ..................................... G11C 7/00
(52) U.S. Cl. .................. 365/207; 365/189.05; 365/210; 365/230.08; 365/203
(58) Field of Search ............... 365/203, 189.05, 365/210, 207, 230.08

(56) References Cited

U.S. PATENT DOCUMENTS 6,144,590 * 11/2000 Markert et al. ................. 365/207

* cited by examiner

*Primary Examiner*—Terrell W. Fears
(74) *Attorney, Agent, or Firm*—Smith, Danamraj & Youst, P.C.

(57) ABSTRACT

A full signal swing differential output path circuit for rapidly transferring a latched data value on a pair of complementary global data nodes ($Q_T$ and $Q_B$) to a single-ended output of a compilable memory instance. At least one tri-statable sense amplifier is disposed between the complementary global data nodes which operates to sense a small differential voltage between a pair of complementary bitlines disposed in a bank of memory storage cells during an access operation associated therewith. A pair of precharge pull up devices are provided for precharging the complementary global data nodes $Q_T$ and $Q_B$ to a predetermined voltage, e.g., $V_{DD}$. In a preferred embodiment, the precharge pull up devices preferably comprise P-channel MOS (PMOS) devices and are actuatable by an active low precharge signal. A first output of the sense amp is coupled to one of the complementary global data nodes ($Q_B$) and the complementary output (i.e., second output) of the sense amp is coupled to the other complementary global data node ($Q_T$) to quickly drive either $Q_T$ or $Q_B$ to ground as soon as the bitline polarity is sensed by the sense amp. The output structure then quickly takes the full differential value between $Q_T$ and $Q_B$ and drives the single-ended output of the memory instance rapidly to either $V_{DD}$ or ground. A CMOS pass gate actuatable by an output enable signal is disposed on the $Q_B$ data path, wherein the pass gate operates to drive an output pull up device coupled to the output of the memory instance. A NOR gate is coupled to the $Q_T$ data path and an inverted signal derived from the output enable signal, wherein the NOR gate operates to drive a output pull down device coupled to the single-ended output of the memory instance.

16 Claims, 5 Drawing Sheets

FAST FULL SIGNAL DIFFERENTIAL OUTPUT PATH CIRCUIT FOR HIGH-SPEED MEMORY

BACKGROUND OF THE INVENTION

1. Technical Field of the Invention

The present invention relates generally to high-speed semiconductor memories. More particularly, and not by way of any limitation, the present invention is directed to compilable memory instances having a fast differential output circuit for rapidly transferring data from tri-statable sense amplifiers ("sense amps") to selected outputs associated therewith.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that performance parameters such as access time, overall memory cycle time, et cetera, play a pivotal role in designing a memory circuit, whether provided in an embedded SOC application or as a stand-alone device. For high speed memories, accordingly, it is desirable that each of the following constituent components of the memory cycle time is minimized as much as possible: clock-to-wordline selection; cell-to-sense amp; and sense amp-to-output. Because the teachings of the present invention are particularly directed to reducing the time delay involved in the sense amp-to-output portion of the cycle time, a brief description of sense amp functionality with respect to RAMs (e.g., Static Random Access Memory or SRAM) is immediately set forth hereinbelow.

RAMs comprising a plurality of memory cells are typically configured as an array of rows and columns, with one or more I/Os (i.e., ×4, ×8, ×16, etc. configurations). Also, such memories may be provided in a multi-bank architecture for applications where high density, high speed and low power are required. Regardless of the architecture and type, each RAM cell is operable to store a single bit of information. Access to this information is facilitated by activating all memory cells in a given row and outputting the data onto bitlines associated with a selected column for providing the stored data value to the selected output. Once the data is disposed on the bitlines, voltage levels on the bitlines begin to separate to opposite power supply rails (e.g., $V_{DD}$ and ground), and a sense amp is utilized to latch the logic levels sensed on the bitlines after they are separated by a predetermined voltage difference, typically 10% or less of $V_{DD}$. Furthermore, the sense amp is usually provided as a differential sense amp, with each of the memory cells providing both a data signal and a data-bar signal on the complementary bitlines (i.e., data lines) associated with each column. In operation, prior to activating the memory cells, the bitlines are precharged and equalized to a common value. Once a particular row and column are selected, the memory cell associated therewith is activated such that it pulls one of the data lines toward ground, with the other data line remaining at the precharged level, typically $V_{DD}$. The sense amp coupled to the two complementary bitlines senses the difference between the two bitlines once it exceeds a predetermined value and the sensed difference is indicated to the sense amp as the differing logic states of "0" and "1".

There are two common types of sense amps utilized for memory devices: one being a current mirror differential sense amp and the other being a clocked-latch type differential sense amp. It is well known that clocked-latch type sense amps are generally more advantageous than current mirror sense amps because they dissipate less power and work better at low voltages. Further, circuitry for implementing a clocked-latch type sense amp utilizes less area.

Even where the clocked-latch type sense amps are employed for memory devices, certain deficiencies and shortcomings exist with respect to the memory cycle time performance. First, usually several stages are required between the sense amp circuitry and corresponding output of the memory instance such that there is a significant delay in transferring the data latched in the sense amp to the output node. Such delay is not desirable in many high-speed applications.

Further, in multi-bank memory architectures prevalent in certain applications, signal paths between the sense amp circuitry and different corresponding outputs are not only variable but traverse longer distances as well. The sense amp-to-output performance in such applications using conventional solutions is also not satisfactory.

SUMMARY OF THE INVENTION

Accordingly, the present invention advantageously provides a full $V_{DD}$ signal swing differential output path circuit for rapidly transferring a latched data value on a pair of complementary "global" data nodes (referred to as $Q_T$ and $Q_B$) to a single-ended output of a compilable memory instance during a memory access operation. In a presently preferred exemplary embodiment of the present invention, at least one tri-statable sense amplifier (sense amp) is disposed between the complementary global data nodes which operates to sense a small differential voltage between a pair of complementary bitlines (BIT and BITB) disposed in a bank of memory storage cells during an access operation associated therewith. A first output of the sense amp is coupled to one of the complementary global data nodes ($Q_B$) and the complementary output of the sense amp is coupled to the other complementary global data node ($Q_T$) to quickly drive either $Q_T$ or $Q_B$ from $V_{DD}$ to ground as soon as the bitline polarity is sensed by the sense amp. The output structure then quickly takes the full differential value between $Q_T$ and $Q_B$ and drives the single-ended output of the memory instance rapidly to either $V_{DD}$ or ground. A pair of precharge pull up devices are provided for precharging the complementary global data nodes $Q_T$ and $Q_B$ to a predetermined voltage, e.g., $V_{DD}$. The precharge pull up devices preferably comprise P-channel MOS (PMOS) devices and are actuatable by an active low precharge signal. A CMOS pass gate actuatable by an output enable signal is disposed on the $Q_B$ data path, wherein the pass gate operates to drive an output pull up device coupled to the output of the memory instance. A NOR gate is coupled to the $Q_T$ data path and an inverted signal derived from the output enable signal, wherein the NOR gate operates to drive a output pull down device coupled to the single-ended output of the memory instance.

In a preferred embodiment, the tri-statable sense amp of the present invention comprises a cross-coupled latch which includes a pair of complementary nodes $L_T$ and $L_B$, wherein the $L_T$ and $L_B$ nodes are driven high by a plurality of equalizing PMOS transistors during the precharge phase. Further, each of the nodes is operable to drive an inverter during the memory access phase, wherein the inverter generates a signal for driving a transistor (NMOS driver) coupled to a corresponding one of the complementary first and second outputs of the sense amp such that either of them is rapidly driven to ground during the memory access phase.

In another aspect, the present invention is directed to a compilable random access memory comprising an array of memory cells arranged in rows and columns, with the memory cells having true and complement data stored therein. Each column of the memory cells is provided with a pair of precharged true and complement bitlines associated therewith, wherein accessing one or more of the memory cells in a selected column or bank causes the voltage level of the associated pair of precharged true and complement bitlines to separate relative to each other. This voltage separation is effectuated in accordance with the true and complement data stored in the memory cell being accessed. Each pair of the precharged true and complement bitlines is associated with a tri-statable sense amp for sensing the voltage levels thereon and latching a data value when the voltage levels on the true and complement bitlines have separated by a predetermined voltage difference. In a presently preferred exemplary embodiment of the present invention, the tri-statable sense amp is clocked by a Sense Amp Enable signal such that the predetermined voltage difference is sensed when the Sense Amp Enable signal is asserted true. A full signal differential output path circuit is included for transferring the data value latched in the tri-statable sense amp to a selected single-ended output of the random access memory upon asserting an output enable signal associated therewith. The differential output path circuit includes a logic portion for selectively driving the selected single-ended output to either a logic high value or a logic low value based on the stored data value.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1A:
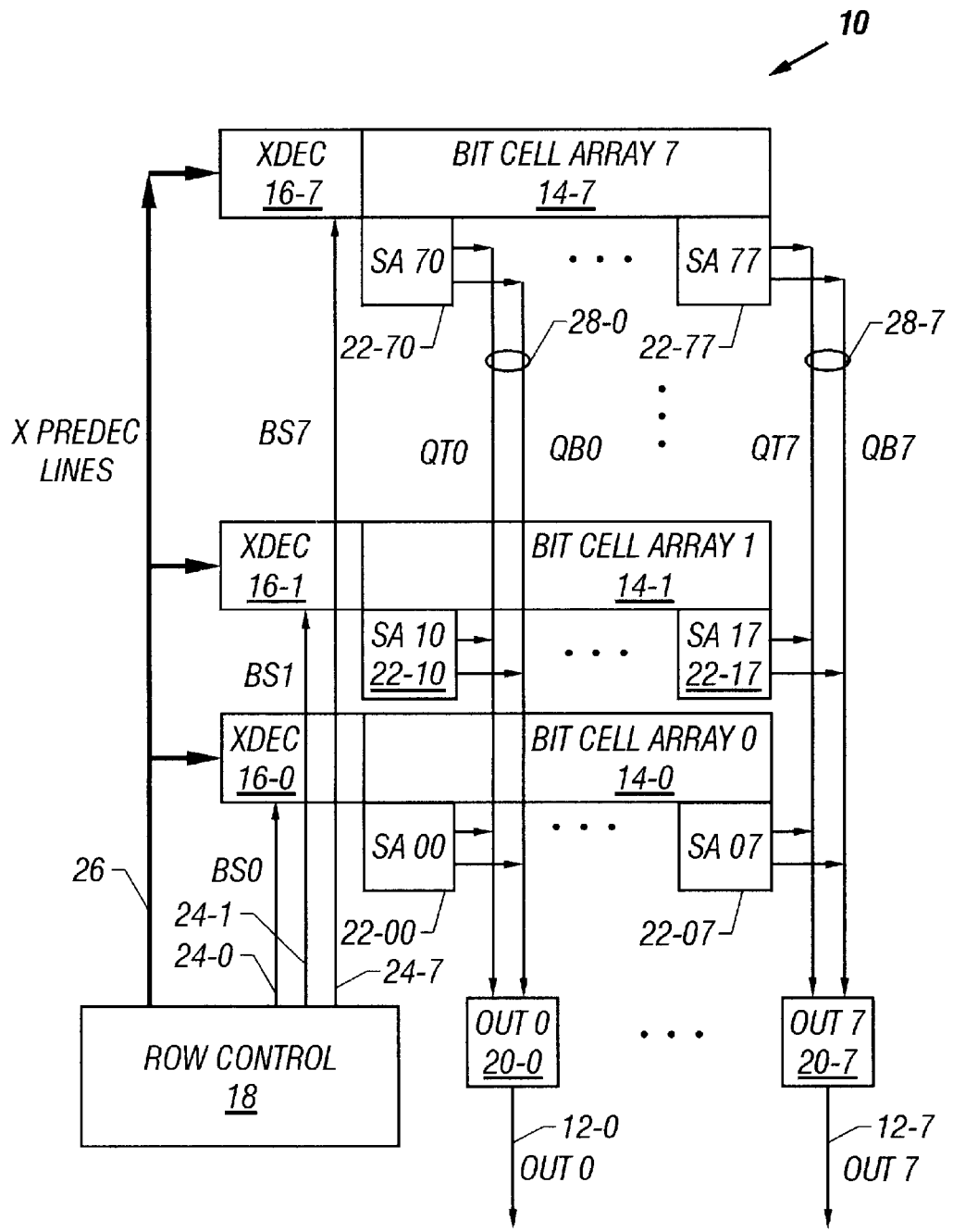
FIG. 1A depicts an exemplary embodiment of a compilable memory instance wherein the teachings of the present invention may be advantageously practiced.

In the drawings, like or similar elements are designated with identical reference numerals throughout the several views thereof, and the various elements depicted are not necessarily drawn to scale. Referring now to FIG. 1A, depicted therein is an exemplary embodiment of a compilable memory instance 10 with eight outputs (reference numerals 12-0 through 12-7) wherein the teachings of the present invention may be advantageously practiced. The memory instance 10 is comprised of a plurality of memory array banks each of which, in turn, comprises the memory cells arranged in rows and columns (not shown). For example, reference numerals 14-0 through 14-7 refer to eight memory array banks or bit cell arrays forming the memory instance 10. The memory cells are preferably of the random access type. In this exemplary embodiment, the memory cells collectively operate as a static random access memory (SRAM) instance.

Each memory array bank is provided with a row decoder block (XDEC) whereby a selected wordline is operable to activate all memory cells in a particular row of the array bank. XDEC blocks 16-0 through 16-7 are exemplified for the array banks 14-0 through 14-7. Each XDEC block is operable to receive a plurality of row predecoder signals 26 and a Bank Select (BS) signal provided by a row control block 18. Eight BS signals are illustrative: BS 24-0 through BS 24-7.

Each column in a memory array bank has associated therewith a pair of complementary bitlines (not shown) which are connected to a sense amp disposed in a sense amp block operable with that memory array bank. In an exemplary memory architecture of the memory instance 10, a single sense amp may be provided for 8 or 16 bitline pairs. A plurality of sense amps are accordingly provided for each memory array bank of the memory instance 10. Each sense amp is operable to sense the output of a given column, as will be described in greater detail hereinbelow.

In the exemplary embodiment depicted in FIG. 1A, eight sense amps (SAs) are provided for each memory array bank. SA 22-00 through SA 22-07 are accordingly illustrated with respect to the memory array bank 14-0. In similar fashion, SA 22-10 through SA 22-17 and SA 22-70 through SA 22-77 are provided for the memory array banks 14-1 and 147, respectively. Each SA provides a complementary pair of outputs to a global data line pair (referred to as $Q_B$ and $Q_T$) associated with a particular output of the memory instance 10. Thus, SA 22-00 through SA 22-70 (which are associated with output 12-0) are operably coupled to the global data line pair 28-0. Similarly, SA 22-07 through SA 22-77 (which are associated with output 12-7) are operably coupled to the global data line pair 28-7. It will be recognized that other conventional circuitry such as column muxes, redundant array portions (if any), dummy wordlines or columns, et cetera, are not depicted in FIG. 1A for clarity.

In accordance with the teachings of the present invention, each global data line pair ($Q_B$ and $Q_T$) is provided to a differential output path circuit block for rapidly transferring a data value present thereon to the corresponding output, as will be described in greater detail hereinbelow. In the exemplary embodiment, eight differential output path circuit blocks (reference numerals 20-0 through 20-7) are illustrated.

Figure 1B:
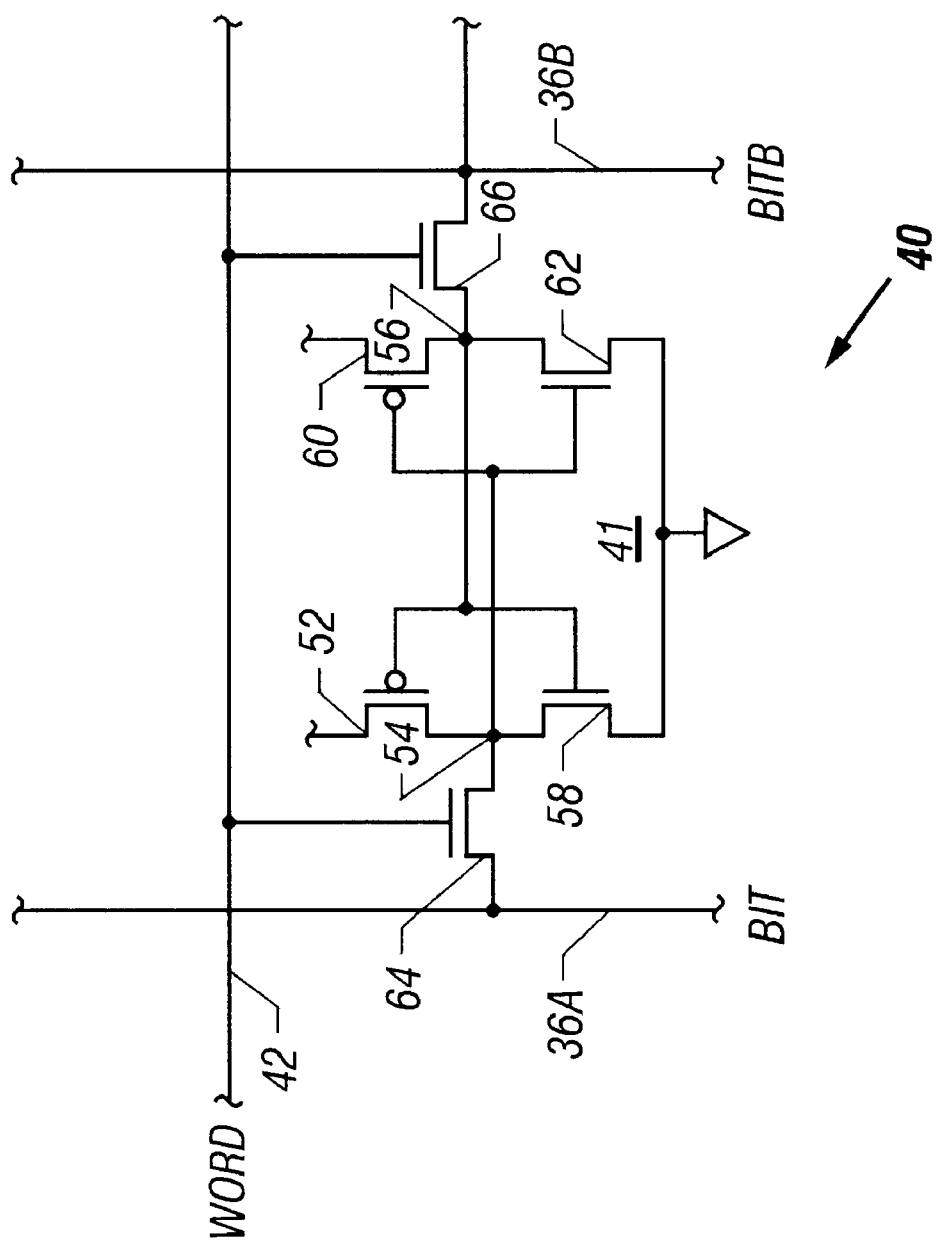
FIG. 1B illustrates a circuit diagram of an SRAM cell disposed in the memory instance.

Referring now to FIG. 1B, illustrated therein is a circuit diagram of an SRAM cell 40 having a pair of complementary bitlines, BIT and BITB (reference numerals 36A and 36B, respectively), associated therewith. Each of the complementary bitlines is coupled to appropriate precharge circuitry (not shown in this FIG.) such that it is pulled to a power supply rail or a reference voltage source (typically $V_{DD}$ or any portion thereof) when the precharge circuitry is activated.

The memory cell 40 is comprised of a cross-coupled CMOS latch 41. A first PMOS transistor 52 has the source/drain thereof connected between $V_{DD}$ and a first data node 54, with the gate thereof connected to a second data node 56, the data nodes 54 and 56 comprising the two complementary storage nodes in the memory cell 40. An NMOS transistor 58 has the source/drain thereof connected between the data node 54 and ground, with the gate thereof connected to the data node 56. A second PMOS transistor 60 has the source/drain thereof connected between $V_{DD}$ and the data node 56, with the gate thereof connected to the data node 54. A second NMOS transistor 62 has the source/drain thereof connected between the data node 56 and ground, and the gate thereof also connected to the data node 54.

A first NMOS access transistor 64 is disposed between BIT 36A and the data node 54, with the gate thereof coupled to a wordline 42. In similar fashion, a second NMOS access transistor 66 has the source/drain thereof connected between BITB 36B and the data node 56, wherein the gate of the NMOS 66 is driven by the wordline 42. The cross-coupled inverters of the memory cell form a latch, where nodes 54 and 56 will always hold complementary full swing data values.

In the initial operation, the wordline 42 is held low and the precharge circuitry associated with the bitlines is activated so as to pull the bitlines to a predetermined high voltage. Since the bitlines 36A and 36B run the entire length of a column of memory cells disposed in the memory array bank, there is a significant amount of capacitance associated with these bitlines. During a read operation, the precharge circuitry (not shown) is turned off and the wordline 42 is activated so as to turn on the access transistors 64 and 66. Accordingly, the data node 54 is coupled to BIT 36A and the data node 56 is coupled to BITB 36B. If, for example, a logic "0" was stored on the data node 54 and a logic "1" was stored on the data node 56, transistor 58 would be turned on and transistor 62 would be turned off. Thus, transistor 58 would pull BIT 36A low, discharging the capacitance on the bitline. Those skilled in the art should readily appreciate that if the bitline itself were utilized to drive an output, the speed of the memory (defined as how fast a transition from one logic level to the other can be effectuated in a normal memory access operation) would be impeded because of the bitline capacitance, which would require a large transistor for the NMOS device 58. However, a sense amp provided in accordance with the teachings of the present invention is advantageously utilized to accurately sense a small signal differential voltage (e.g., 100 mV) between the data nodes and rapidly transfer the full signal complementary data to the output via a high speed full swing differential output path circuit disposed between the sense amp and the output.

Figure 2A:
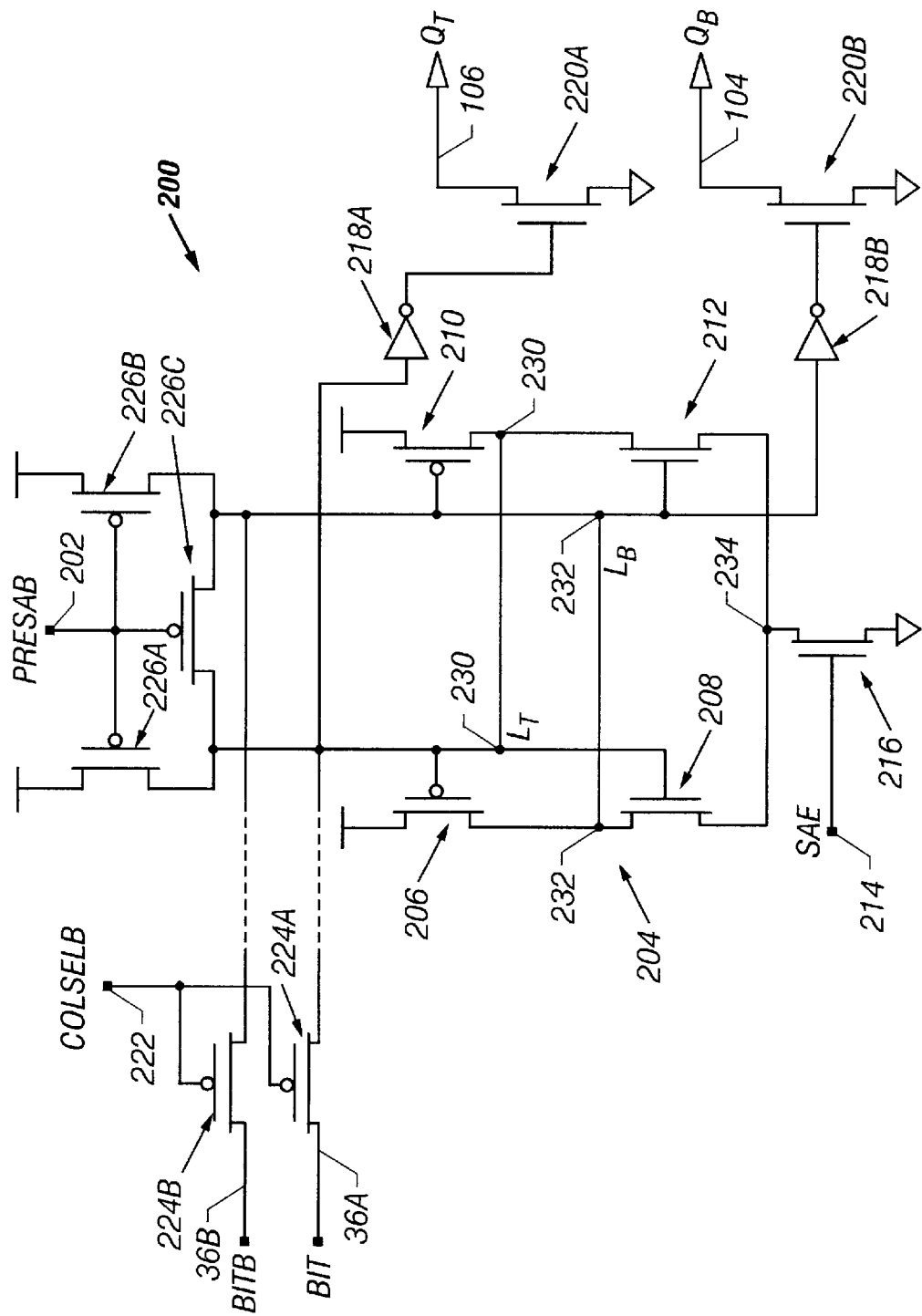
FIG. 2A illustrates a circuit diagram of a tri-statable sense amp structure provided in accordance with the teachings of the present invention.

Referring now to FIG. 2A, depicted therein is a circuit diagram of a tri-statable sense amp structure 200 provided in accordance with the teachings of the present invention for sensing the logic levels of the complementary bitlines 36 and 36B of a memory cell. Those skilled in the art should recognize that although only a single pair of complementary bitlines (and associated PMOS transistors 224A and 224B) are illustrated herein, multiple sets may preferably be provided, e.g., in sets of 8, 16, etc. in the practice of the present invention. Furthermore, with reference to the exemplary embodiment depicted in FIG. 1A, each SA illustrated therein comprises the tri-statable sense amp structure 200 described hereinbelow.

The sense amp structure 200 operates to provide a pair of complementary outputs which are coupled to a pair of complementary global data nodes $Q_T$ and $Q_B$ (reference numerals 106 and 104, respectively). Additionally, in accordance with the teachings of the present invention, the complementary global data nodes $Q_T$ and $Q_B$ are used to drive a full signal swing differential output path circuit for rapidly transferring an appropriate data value to a common single-ended output node (not shown in this FIG.) based on the logic levels of the bitlines 36A and 36B when a COLSELB signal 222 is activated.

A cross-coupled CMOS latch 204 is provided for sensing the memory cell logic levels and latching appropriate data for outputting. A pair of NMOS transistors (reference numerals 208 and 212) and a pair of PMOS transistors (reference numerals 206 and 210) arranged as CMOS inverters are cross-coupled to provide two complementary nodes, $L_T$ and $L_B$ (reference numerals 230 and 232, respectively). Initially, the $L_T$ and $L_B$ nodes in the sense amp are pulled high during a precharge operation wherein an active low signal called PRESAB 202 is activated so as to turn on three PMOS transistors (reference numerals 226A–226C, hereinafter referred to as equalizing transistors) by substantially simultaneously driving the gates thereof. During the precharge operation, the COLSELB signal 232 is deactivated such that the logic levels of the complementary bitlines 36A and 36B have no effect on the $L_T$ and $L_B$ nodes 230 and 232, as they are decoupled from the bitlines by virtue of the deactivated PMOS transistors 224A and 224B disposed therebetween. Accordingly, the complementary sense amp outputs 217A and 217B are tri-stated during precharge because inverters 218A and 218B driving NMOS transistors 220A and 220B, which inverters are provided between the NMOS transistors and $L_T$ and $L_B$ nodes, respectively, generate a logic low to turn off the transistors (which operate as sense amp output drivers).

During a read operation, the COLSELB signal 222 is activated (i.e., asserted low) and the PRESAB signal 202 is deactivated. Whereas PMOS transistors 226A–226C are correspondingly turned off, PMOS transistors 224A and 224B are turned on, thereby coupling $L_T$ node 230 to BIT 36 and $L_B$ node 232 to BITB 36B. If, for example, the voltage levels to be sensed on BIT and BITB are $V_{DD}$ and $V_{DD}$—200 mV, respectively, transistors 208 and 210 are activated while transistors 206 and 212 are turned off once the SAE signal 214 is driven high, activating transistor 216. Accordingly, node 234 is pulled down to ground, which will cause the cross-coupled inverters to drive $L_B$ to ground and hold $L_T$ at $V_{DD}$. Because the PMOS transistor 210 has been activated, node 230 is driven high. Accordingly, the output of inverter 218A is driven low which continues to deactivate the NMOS transistor 220A, thus maintaining the tri-stated sense amp output 217A. The output of inverter 218B is driven high because of the low input from node 232, thereby turning on the NMOS transistor 220B. Thus, the other complementary output 217B of the sense amp structure is pulled low.

Those skilled in the art should readily recognize that if the data to be sensed on the BIT and BITB were "0" and "1" respectively, an opposite result would be obtained because transistors 206 and 212 would be activated, thereby driving node 230 low and node 232 high. Accordingly, the output 217B remains tri-stated while the output 217B is driven low.

Figure 2B:
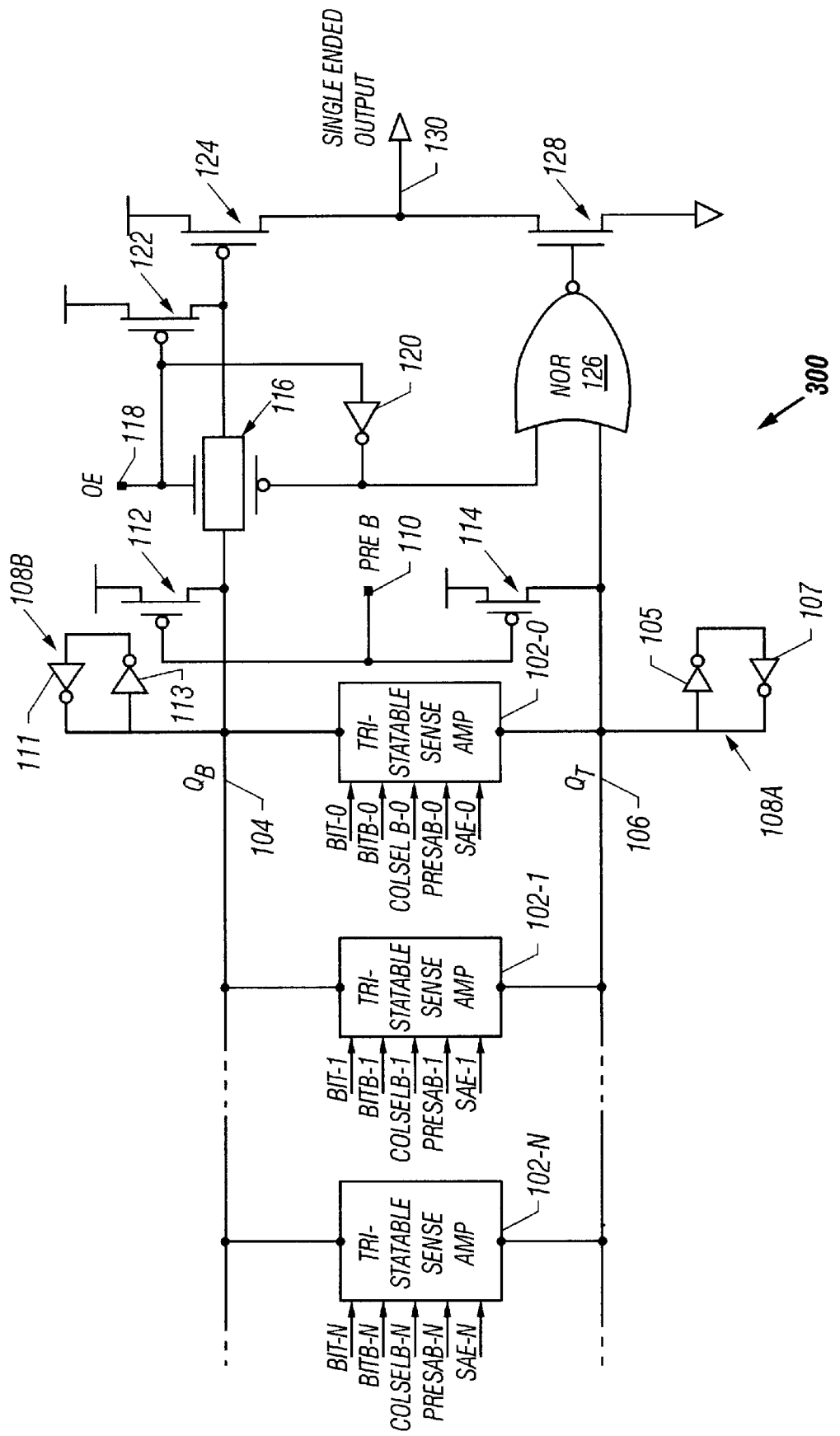
FIG. 2B illustrates a circuit diagram of a fast differential output path for transferring data from a tri-statable sense amp to a selected single-ended output of the memory instance in accordance with the teachings of the present invention.

Referring now to FIG. 2B, depicted therein is a simplified diagram of a fast differential output path circuit 300 for rapidly transferring data from a tri-statable sense amp to a selected single-ended output of the memory instance in accordance with the teachings of the present invention. A plurality of tri-statable sense amps (e.g., reference numerals 102-0 through 102-N), each being operable as set forth above, are provided for a select single-ended output 130 from a memory instance such as the memory instance 10 described hereinabove with reference to FIG. 1A. It should be apparent that in one exemplary embodiment, the number of sense amps may depend on the number of array banks associated with the single-ended output 130. For example, with reference to FIG. 1A, because eight array banks are associated with each output (reference numerals 12-0 through 12-7), eight SAs per output are accordingly exemplified, wherein each differential output path circuit block comprises the fast differential output path circuit 300 described hereinbelow.

The complementary $Q_T$ and $Q_B$ outputs from each tri-statable sense amp are respectively coupled to provide common complementary global data paths $Q_T$ and $Q_B$ for the output 130. Accordingly, such global data paths are illustrative of the global data line pairs 28-0 through 28-7 depicted in FIG. 1A. Logic levels present on the data paths associated with the $Q_T$ and $Q_B$ nodes 106, 104 (which data paths and nodes are interchangeably referred to hereinafter) operate to drive the fast differential output path circuit 300 for data outputting. Further, each tri-statable sense amp receives the following signals for effectuating the operations described above with respect to a particular column in the memory instance: BIT, BITB, COLSELB, PRESAB, and SAE.

Initially, a PREB signal 110 is utilized in order to precharge the $Q_T$ and $Q_B$ data nodes (and paths) to a predetermined voltage, e.g., $V_{DD}$. A pair of PMOS pull up transistors 112 and 114 (precharge pull up devices) are operably coupled to the $Q_T$ and $Q_B$ data nodes for this purpose. Thereafter, the PREB signal 110 is deactivated pursuant to a memory access operation with respect to a particular memory cell (i.e., a read operation), whereupon the data on the BIT and BITB lines of the memory cell is sensed by the tri-statable sense amp associated therewith as described in greater detail hereinabove. Accordingly, suitable voltage levels are provided on the $Q_T$ and $Q_B$ data nodes for outputting to the single-ended output node 130, which levels are latched by small latches 108A and 108B coupled to the $Q_T$ and $Q_B$ data nodes, respectively.

In a presently preferred exemplary embodiment of the present invention, each of latches 108A and 108B comprises a pair of coupled inverters, inverters 105 and 107 forming latch 108A, and inverters 111 and 113 forming latch 108B.

Preferably, inverters 105 and 113 are comprised of devices relatively small, whereas inverters 107 and 111 are comprised of devices that are substantially significantly smaller.

A full CMOS pass gate 116 is operably disposed on the $Q_B$ data path 104, which pass gate is selectively activatable by an Output Enable (OE) signal 118. The OE 118 is also operable to drive a PMOS pull up transistor 122 coupled to the output of the pass gate 106, which output drives a PMOS output pull up driver 124 coupled to the single-ended output node 130. The PMOS pull up transistor 122 disposed on the $Q_B$ path operates as a tri-stating device for tri-stating the output node 130 when the OE signal is driven low. An inverter 120 is provided to invert the OE signal 118 in order to drive the PMOS transistor of the pass gate 116. The inverted OE signal is also provided to a NOR gate 126 which receives the $Q_T$ data path 106 as its other input. The output of the NOR gate 126 is operable to drive an NMOS pull down driver 128 coupled to the single-ended output node 130. Therefore, when the OE signal is low, output transistors 124 and 128 are both turned off, thereby tri-stating the output node 130.

In general operation with respect to a selected memory array bank, the fast differential output path circuit 300 transfers the latched data value to the single-ended output 130 as follows when the OE signal 118 is asserted. Initially, $Q_B$ and $Q_T$ are driven high by the precharge transistors 112 and 114 at the beginning of the read cycle, while a differential voltage is appearing on BIT and BITB. The PREB signal is then driven high just prior to the SAE signal being driven high in the selected bank of the memory instance. The SAE signal being driven high in the selected bank will drive either $Q_B$ or $Q_T$ quickly to a low (ground) level. For example, when the $Q_B$ data path 104 is driven low and the $Q_T$ data path 106 correspondingly remains high because of the stored values of "1" and "0" on BIT and BITB in the accessed memory cell, the pass gate 116 is operable to pass the $Q_B$ data value to drive the PMOS transistor 124 because the NMOS and PMOS devices in the pass gate are turned on by the asserted OE signal and its inverted signal, respectively. Also, the pull up PMOS transistor 122 is turned off by the asserted OE signal 118. Accordingly, the gate of the output pull up PMOS transistor 124 is driven low and the device operates to pull the output node 130 high. On the other hand, the output of the NOR gate 126 is driven low because of the logic high on the $Q_T$ data path 106 and the inverted OE signal which are provided thereto as input. Correspondingly, the output pull down NMOS transistor 128 is turned off. Cumulatively, therefore, the stored true data bit value of "1" is provided to the single-ended output node 130 by the differential output path circuit 300.

Accordingly, it should be appreciated by those skilled in the art that in a multi-bank memory instance such as the memory instance 10 depicted in FIG. 1A, the SAs of the unselected banks are tri-stated because the gates of the NMOS devices are held low, causing $Q_B$ and $Q_T$ to be tri-stated (since the PRESAB signals are held low).

Figure 3:
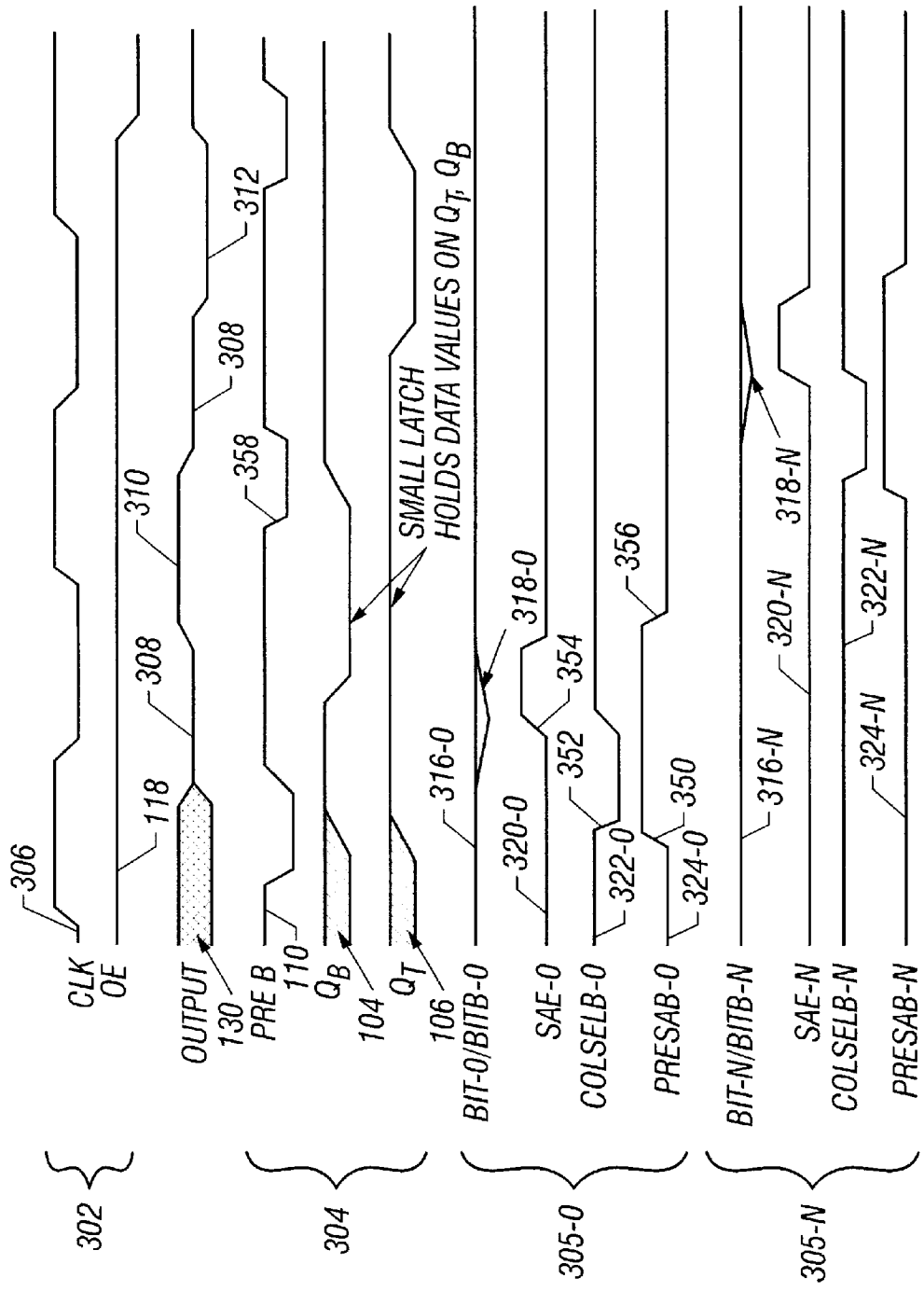
FIG. 3 is a timing diagram which depicts timing relationships among the various signals used in the practice of the present invention, wherein accessing of a data bit "1" from memory bank 0 followed by accessing a data bit "0" from memory bank N is exemplified.

Referring now to FIG. 3, depicted therein is a timing diagram which illustrates timing relationships among the various signals used in the practice of the present invention, particularly exemplifying the accessing of a data bit "1" from memory bank 0 followed by accessing a data bit "0" from memory bank N in a multi-bank memory instance. A clock (CLK) signal 306 and OE 118 comprise externally applied signals 302 to the memory instance in connection with the memory accesses. The output signal 130 from the memory instance is driven to a tri-stated phase 308 at the commencement of the first memory read access process. A plurality of global signals 304 are available within the memory instance for effectuating the differential output data transfer path in accordance with the teachings of the present invention set forth herein: $Q_B$ data node signal 104; $Q_T$ data node signal 106; and PREB 110. As described in the foregoing, the PREB signal 110 is asserted low during the precharge operation at the beginning of each read cycle, whereby the $Q_B$ and $Q_T$ data paths/nodes are pulled up, tri-stating the output 130. A plurality of signals (reference numeral 305-0) within memory bank 0 and a plurality of signals (reference numeral 305-N) within memory bank N are available for effectuating memory accesses associated respectively therewith. With respect to memory bank 0, these signals comprise: BIT-0/BITB-0 signals 316-0; SAE-0 signal 320-0; COLSELB signal 322-0; and PRESAB-0 signal 324-0. Similarly, with respect to memory bank N, these signals comprise: BIT-N/BITB-N signals 316-N; SAE-N signal 320-N; COLSELB signal 322-N; and PRESAB-N signal 324-N. It should be readily apparent to those skilled in the art that these signals have been described in greater detail hereinabove with respect to the general operation of the tri-statable sense amp of the present invention.

In connection with the accessing of a data bit "1" in memory bank 0, the PRESAB-0 signal 324-0 is driven high so as to deactivate the precharging of the sense amp provided therein, as indicated by a rising edge 350 in the signal. Also, the COLSELB-0 signal 322-0 is asserted by driving it low, as indicated by a falling edge 352 therein. Because the BIT-0 and BITB-0 values are respectively 1 and 0 in this example, the voltage differential by which the BITB-0 line separates from the BIT line by the small memory bit cell read current is indicated by a slope 318-0 in the signal 316-0. The SAE-0 signal 322-0 is thereafter activated by driving it high, as indicated by a rising edge 352 therein.

Subsequently, the $Q_B$ data signal is driven very quickly to the low level, transferring a low level through the pass gate 116 to drive the output 130 to a full $V_{DD}$ "1" (as indicated by the reference numeral 310) with only one pass gate plus one transistor delay from $Q_b$. After sensing the data, the SAE-0 and COLSELB-0 signals are deactivated by driving them low and high, respectively. A falling edge 356 in the PRESAB-0 signal tri-states the NMOS drivers on the complementary outputs from the sense amp coupled to the $Q_T$ and $Q_B$ nodes. However, the data is passively latched on the $Q_T$ and $Q_B$ data paths by the smaller feedback latches 108A and 108B.

In the precharge operation at the beginning of the next access operation, the PREB signal is activated by driving it low, as indicated by a falling edge 358 therein. Subsequently, both $Q_T$ and $Q_B$ data paths are pulled high and the output signal 130 is tri-stated again (as indicated by the reference numeral 308).

For accessing a data value of "0" from BIT-N of bank N of the memory instance, a similar sequence of operations takes place with respect to the signals 305-N. The $Q_T$a signal is now very quickly driven low, transferring a "0" value to the output 130 (as indicated by the reference numeral 312) with only a two-stage delay through the NOR gate 126 and pull down NMOS device 128. Data is passively latched by latches 108A and 108B.

Based on the foregoing, it should be appreciated that the present invention advantageously provides a full signal swing differential output path circuit for rapidly transferring a latched data value to a single-ended output of a compilable memory instance using only five logic stages disposed between the sense amp and the output, thereby effectively reducing one of the critical components constituting the overall memory cycle time. Furthermore, those skilled in the art should readily recognize that the present invention is particularly advantageous in multi-bank memory architectures where significant distances are typically disposed between the sense amp circuitry and the outputs. By utilizing precharge to $V_{DD}$ at the beginning of read cycles and NMOS-only drivers on the complementary sense amp outputs for driving the global $Q_B$ and $Q_T$ data nodes, a faster transition is advantageously achieved in the logic levels thereon.

Additionally, it is believed that the operation and construction of the present invention will be apparent from the foregoing Detailed Description. While the process and circuitry shown and described have been characterized as being preferred, it should be readily understood that various changes and modifications could be made therein without departing from the scope of the present invention as set forth in the following claims. For example, although SRAM type compilable memory has been particularly exemplified herein, the teachings of the present invention may be practiced in other memory types and architectures where sense amp circuitry is utilized for data access operations. Further, the specific components and gates comprising the tri-statable sense amps and the differential output path circuitry should be deemed to be only illustrative rather than limiting, as one of skilled in the art should readily recognize that identical or substantially similar logic functionality may be obtained by different device/gate implementations. Accordingly, all such modifications, substitutions, extensions, additions, combinations, et cetera, should be considered to be within the ambit of the present invention whose scope is limited solely by the claims appended hereinbelow.

What is claimed is:

1. A full signal swing differential output path circuit for transferring a latched data value on a pair of complementary global data nodes to a single-ended output of a memory instance, comprising:

at least one tri-statable sense amplifier disposed between said complementary global data nodes, said at least one tri-statable sense amplifier operating to sense a predetermined differential voltage between a pair of complementary bitlines disposed in a bank of storage cells pursuant to a memory access, said bank of storage cells forming at least a portion of said memory instance, wherein a first output of said at least one tri-statable sense amplifier is coupled to a select one of said complementary global data nodes and a second output of said at least one tri-statable sense amplifier is coupled to the other complementary global data node;

a pair of latches operating to latch logic levels on said complementary global data nodes;

a first precharge pull up device coupled to said one of said complementary global data nodes and a second precharge pull up device coupled to said other one of said complementary global data nodes, said precharge pull up devices being actuatable by a precharge signal;

a pass gate coupled to said one of said complementary global data nodes, said pass gate being actuatable by an output enable signal, said pass gate operating to drive an output pull up device coupled to said single-ended output of said memory instance; and a NOR gate coupled to said other one of said complementary global data nodes and an inverted signal derived from said output enable signal, said logic gate operating to drive a output pull down device coupled to said single-ended output of said memory instance, wherein said single-ended output of said memory instance is pulled to one of a logic high value and a logic low value based on said latched data value on said pair of complementary global data nodes, provided said output enable signal is activated and said precharge signal is deactivated.

2. The full signal swing differential output path circuit as set forth in claim 1, wherein each of said pair of latches comprises a pair of coupled inverter gates.

3. The full signal swing differential output path circuit as set forth in claim 1, wherein each of said first and second precharge pull up devices comprises a P-channel MOS transistor.

4. The full signal swing differential output path circuit as set forth in claim 1, wherein said pass gate comprises a CMOS pass gate having an N-channel MOS transistor coupled to a P-channel MOS transistor, and further wherein said output enable signal drives said N-channel MOS transistor and said inverted signal drives said P-channel MOS transistor.

5. The full signal swing differential output path circuit as set forth in claim 1, further comprising a tri-stating pull up device coupled to an output of said pass gate, wherein said tri-stating pull up device is actuatable by said output enable signal.

6. The full signal swing differential output path circuit as set forth in claim 5, wherein said output pull up device comprises a P-channel MOS transistor and said output pull down device comprises an N-channel MOS transistor.

7. The full signal swing differential output path circuit as set forth in claim 6, wherein said tri-statable sense amplifier comprises a cross-coupled latch which includes a pair of complementary nodes, said complementary nodes being driven high by a plurality of equalizing P-channel MOS transistors during a precharge cycle.

8. The full signal swing differential output path circuit as set forth in claim 7, wherein each of said complementary nodes of said tri-statable sense amplifier is operable to drive an inverter, said inverter driving an output driver coupled to a corresponding one of said outputs from said tri-statable sense amplifier.

9. The full signal swing differential output path circuit as set forth in claim 8, wherein said bank of storage cells comprises static random access memory (SRAM) cells.

10. The full signal swing differential output path circuit as set forth in claim 8, wherein said bank of storage cells comprises random access memory (RAM) cells.

11. A compilable random access memory, comprising:

an array of memory cells arranged in rows and columns, with said memory cells having true and complement data stored therein, each column of said memory cells having a pair of precharged true and complement bitlines associated therewith, wherein accessing one of said memory cells in a selected column causes the voltage level of said pair of precharged true and complement bitlines associated therewith to separate relative to each other in accordance with said true and complement data stored in said one of said memory cells;

a tri-statable sense amplifier associated with each pair of said precharged true and complement bitlines for sensing the voltage levels thereon and latching a data value when the voltage levels on said true and complement bitlines have separated by a predetermined voltage difference, wherein said tri-statable sense amplifier is clocked by a Sense Amp Enable signal such that said tri-statable sense amplifier operates to sense said predetermined voltage difference when said Sense Amp Enable signal is asserted true; and a full signal swing differential output path circuit for transferring said data value latched in said tri-statable sense amplifier to a selected single-ended output of said random access memory upon asserting an output enable signal associated therewith, said differential output path circuit having a logic portion for selectively driving said selected output to one of a logic high value and a logic low value based on said data value.

12. The compilable random access memory as set forth in claim 11, wherein said logic portion comprises at most five logic stages between said tri-statable sense amplifier and said selected single-ended output.

13. The compilable random access memory as set forth in claim 12, wherein said full signal swing differential output path circuit is coupled to a pair of complementary global data nodes, said complementary global data nodes having logic levels based on said data value, and further wherein a CMOS pass gate forming a portion of said logic portion is coupled to on one of said complementary global data nodes and a NOR gate forming another portion of said logic portion is coupled to the other one of said complementary global data nodes.

14. The compilable random access memory as set forth in claim 13, wherein said CMOS pass gate operates to drive an output pull up device coupled to said selected single-ended output, said CMOS pass gate being actuatable by said output enable signal.

15. The compilable random access memory as set forth in claim 14, wherein said output pull up device comprises a P-channel MOS transistor.

16. The compilable random access memory as set forth in claim 14, wherein said NOR gate operates to drive an output pull down device coupled to said selected single-ended output, said NOR gate receiving as inputs said other one of said complementary global data nodes and an inverted signal derived from said output enable signal.

* * * * *

UNITED STATES PATENT AND TRADEMARK OFFICE
CERTIFICATE OF CORRECTION

PATENT NO. : 6,249,471 B1
DATED : June 19, 2001
INVENTOR(S) : Richard S. Roy

It is certified that error appears in the above-identified patent and that said Letters Patent is hereby corrected as shown below:

Column 6,
Line 50, "217A" should read -- 106 --;
Line 50, "217B" should read -- 104 --.

Column 7,
Line 5, "217A" should read -- 106 --;
Line 8, "217B" should read -- 104 --;
Line 14, the first "217B" should read -- 104 --; and the second "217B" should read -- 106 --.

Signed and Sealed this

Twenty-third Day of April, 2002

Attest:

Attesting Officer

JAMES E. ROGAN
*Director of the United States Patent and Trademark Office*